United States Patent [19]

Millar

[11] Patent Number: 5,121,395
[45] Date of Patent: Jun. 9, 1992

[54] TRANSMISSION ERROR PROTECTION FOR TDMA DIGITAL CHANNELS

[75] Inventor: Douglas J. Millar, Soeurs, Canada

[73] Assignee: Northern Telecom Limited, Montreal, Canada

[21] Appl. No.: 473,518

[22] Filed: Feb. 1, 1990

[30] Foreign Application Priority Data

Sep. 11, 1989 [CA] Canada .................................. 610910

[51] Int. Cl.⁵ .............................................. G06F 11/10
[52] U.S. Cl. ...................................... 371/39.1; 371/2.1
[58] Field of Search ................ 371/39.1, 38.1, 37.1, 371/2.1; 370/13, 77; 375/10; 379/59

[56] References Cited

U.S. PATENT DOCUMENTS

| | | | |
|---|---|---|---|
| 3,423,729 | 1/1969 | Heller | 371/38.1 |
| 4,491,943 | 1/1985 | Iga | 371/39.1 X |
| 4,559,625 | 12/1985 | Berlekamp | 371/2.1 |
| 4,835,772 | 5/1989 | Peile | 371/39.1 |
| 4,901,319 | 2/1990 | Ross | 371/39.1 X |
| 4,914,655 | 4/1990 | Johannes | 371/37.1 X |
| 4,928,288 | 5/1990 | D'Aria | 371/37.5 X |

*Primary Examiner*—Robert W. Beausoliel
*Attorney, Agent, or Firm*—Jean-Pierre Fortin

[57] ABSTRACT

There is provided a method of reducing the effects of transmission errors in a digital cellular mobile radio system in which R-S symbols are transmitted over a radio channel in two bursts, separated in time. This technique provides sufficient R-S error protection to recover the data if one of the bursts is entirely erased due to channel errors. With a TDMA channel format, speech data is sent in bursts over the radio channel. Each transmission bursts contain only half of the R-S symbols for a given R-S code block. The two bursts, comprising a complete R-S block, are separated in time so that a short Raleigh fade in the transmission channel is only likely to affect one of the bursts, allowing the data to be completely recovered from the unaffected burst. In order to provide sufficient error correcting power for this purpose, the R-S algorithm assumes that the number of protection symbols is at least as large as the number of data symbols. Information regarding the likelihood of correctly decoding each of the received radio symbols (e.g. di-bits in the case of 4-phase DPSK transmission) is used to predict those R-S symbols most likely to be in error. Those that are found likely to be in error are marked as erased. This technique improves the recovery rate of the speech information bits.

10 Claims, 7 Drawing Sheets

TRANSMISSION ERROR PROTECTION FOR TDMA DIGITAL CHANNELS

This invention relates to digital cellular mobile radio systems and more particularly to a novel technique for combatting the effects of transmission errors on the quality of digitally coded speech.

BACKGROUND OF THE INVENTION

In digital mobile radio systems, coded speech signals are transmitted over Raleigh fading channels where errors are due to adjacent and co-channel interference. To improve performance, Reed-Solomon (R-S) coding has been employed. This technique adds protection bits to the speech information bits, thereby providing the capability to correct errors within the individual R-S symbols. Each R-S symbol is transmitted as one or more radio symbols. In a typical implementation, a radio symbol consists of 2 bits, and each R-S symbol is comprised of 3 radio symbols. The radio symbol di-bits might, for example, be encoded using DQPSK modulation.

Information regarding the likelihood of each received radio symbol being correctly decoded is derived from the radio symbol decoding process. This information is used to predict those R-S symbols most likely to be in error, which are then marked as erased. This information regarding which R-S symbols are erased is used to increase the error correcting power of the R-S algorithm.

R-S coding schemes are described in a reference entitled "Error Control Coding: Fundamentals and Applications", Shu Lin, David J. Costello, Jr., Chapter 6 - BCH codes.

SUMMARY OF THE INVENTION

In the present invention, the R-S symbols are transmitted over the radio channel in two bursts, separated in time. This technique provides sufficient R-S error protection to recover the data if one of the bursts is entirely erased due to channel errors. With a TDMA channel format, speech data is sent in bursts over the radio channel. In this invention, each transmission burst contains only half of the R-S symbols for a given R-S code block. The two bursts, comprising a complete R-S block, are separated in time so that a short Raleigh fade in the transmission channel is only likely to affect one of the bursts, allowing the data to be completely recovered from the unaffected burst. In order to provide sufficient error correcting power for this purpose, the R-S algorithm assumes that the number of protection symbols is at least as large as the number of data symbols.

Information regarding the likelihood of correctly decoding each of the received radio symbols (e.g. dibits in the case of 4-phase DPSK transmission) is used to predict those R-S symbols most likely to be in error. Those that are found likely to be in error are marked as erased. This technique improves the recovery rate of the speech information bits.

DESCRIPTION OF THE PREFERRED EMBODIMENT

Figure 1:
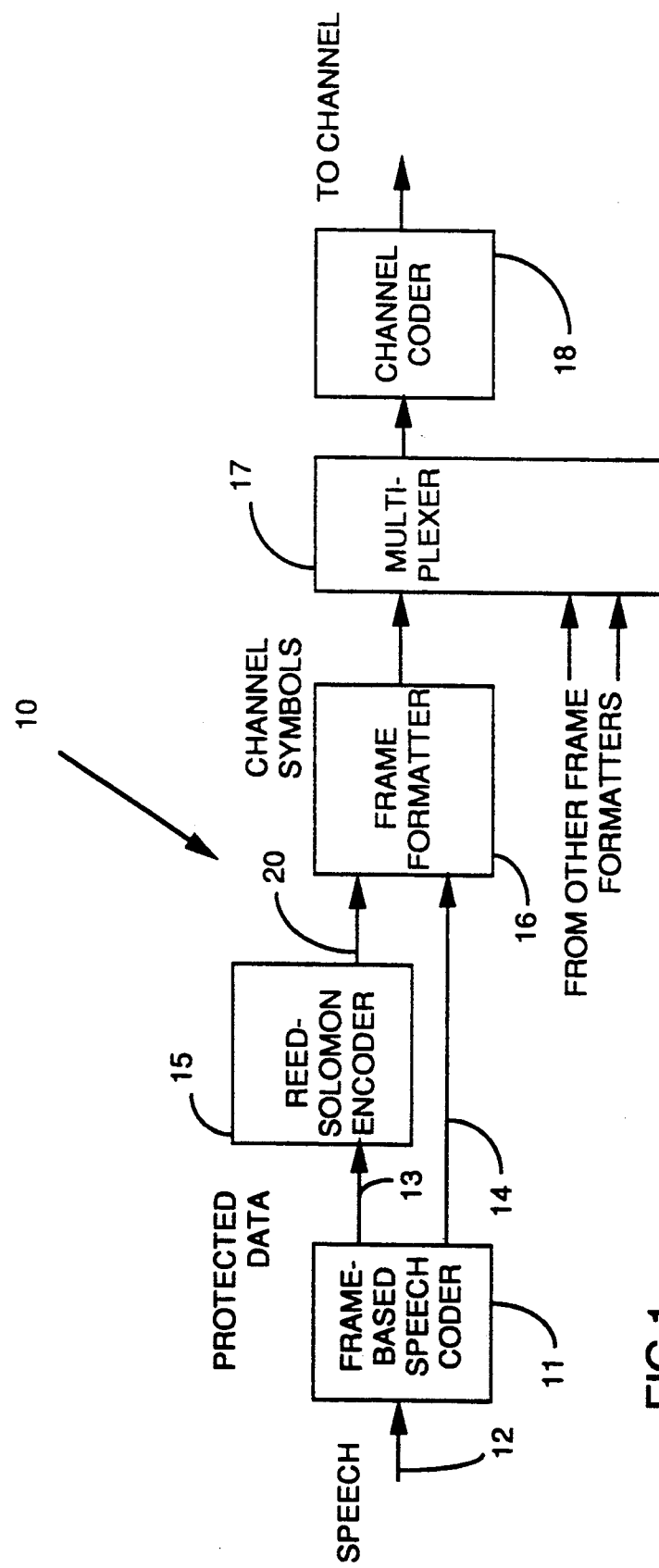
FIG. 1 is a block diagram of the speech encoding section of the radio transmitter according to the present invention.

Referring now to FIG. 1, there is shown the speech encoding section 10 of a transmitter. Generally, the transmitter accepts a speech waveform and computes from it a digital bit stream, containing both a coded description of the speech and additional parity protection bits. This stream is transmitted over the channel and subjected to corruption by transmission errors.

It is a property of most frame-based speech coders that the effect on received speech quality of corrupting bits in the encoded bit stream is greater for some bit fields than for others.

The speech encoding section 10 includes a frame-based speech coder 11 which encodes each short time frame of the input speech waveform 12 into two bit fields. The first, called the protected data 13, is the one whose disturbance by transmission errors results in the most significant degradation of speech quality. The second, called the unprotected data 14, is less sensitive to transmission errors.

A Reed-Solomon encoder 15 segments the protected input data 13 into Reed-Solomon symbols with 6 bits per symbol in a preferred implementation. It then calculates a number of parity symbols and appends them to the input symbols, as described in the above reference by Shu Lin, to form a block of symbols. Only the first bit field is protected, using R-S coding, so as to make best use of the available protection bits within the limited transmission rate available. This extended symbol list is a Reed-Solomon block code and is sent to the frame formatter 16. In the preferred implementation a (24,12) block code is used. The total number of symbols being (24). The number of data symbols is (12) and therefore contains (72) bits of speech data. The number of parity symbols is also (12) and also contains (72) bits of parity. Other R-S block sizes can be used, provided the number of parity symbols is greater than or equal to the number of speech data symbols.

Figure 2:
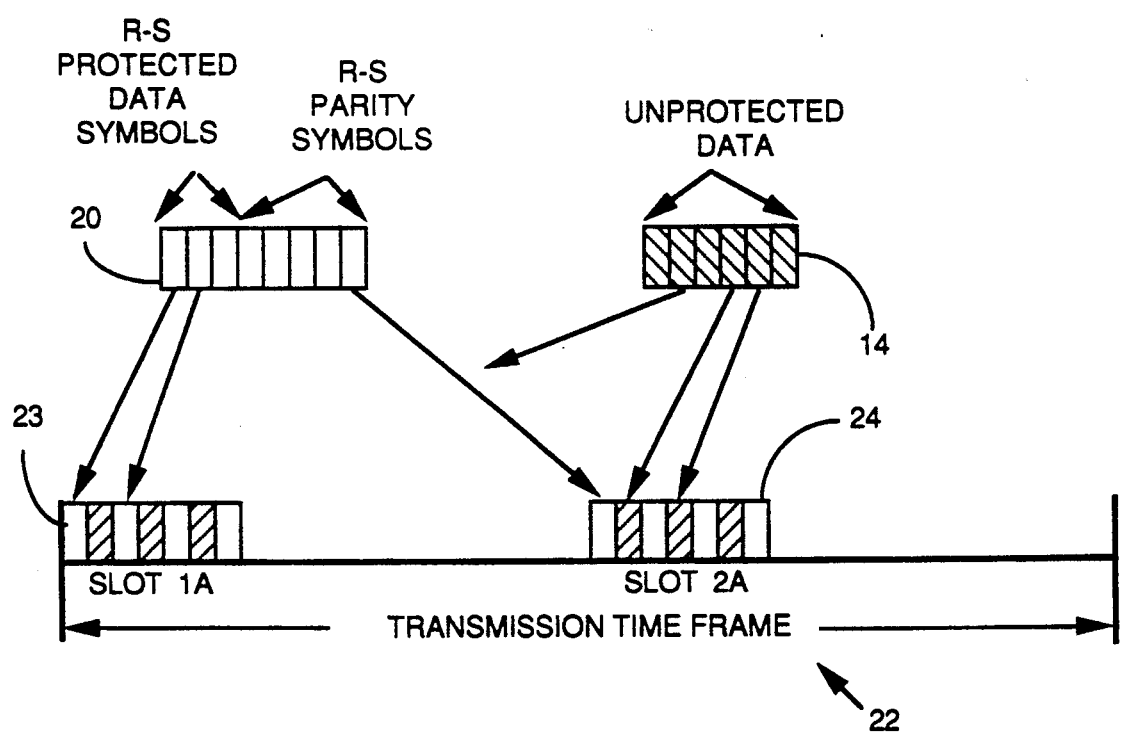
FIG. 2 is an illustrative example of the frame formatting scheme of the present invention.

The frame formatting scheme is represented in FIG. 2. The frame formatter 16 accepts the Reed-Solomon block code 20 and the unprotected data 14. For best immunity to slow fades, the R-S symbols representing the protected field are interleaved with the remaining unprotected bits and positioned in time within the TDMA transmission time frame 22, in preparation for channel coding and transmission. Each R-S symbol remains contiguous in time, but the total field is separated into two halves and transmitted as two slots separated in time from each other, within a TDMA channel, as shown at reference numerals 23 and 24. Therefore, for each channel, the TDMA transmission format consists of two slots (transmission bursts 23 and 24) per transmission time frame 22. In the preferred implementation there are twelve R-S symbols in each slot.

The multiplexer block 17, in FIG. 1 combines the formatted bits from a number of speech channels (three channels in the preferred implementation). They are multiplexed in time to produce a full TDMA transmission time frame.

Figure 3A:
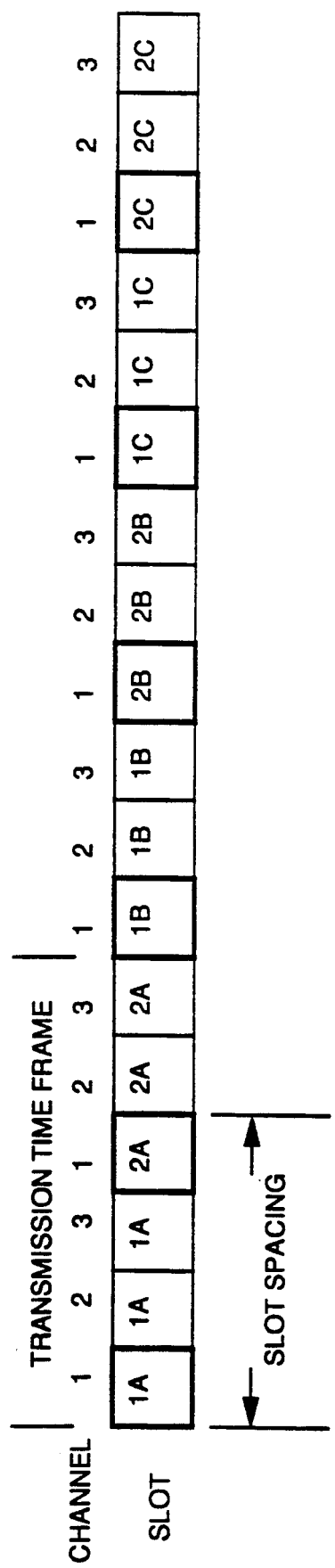
FIGS. 3a and 3b are illustrative diagrams of frame formats which can be used in the present invention.
Figure 3B:
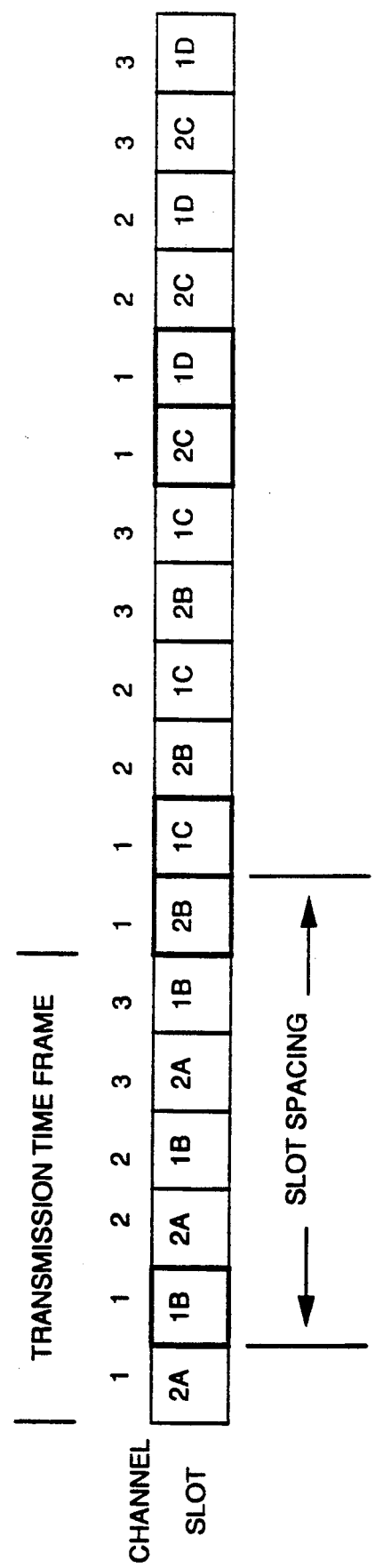

FIGS. 3a and 3b illustrate two formatting concepts which can be used with the present invention. In FIG. 3a, the serial transmission is represented by a series of bit fields or slots spaced apart by bit fields of other channels. For example, the first bit field (slot 1A) of channel 1 is separated from the second bit field (slot 2B) by the first bit field (slot A) of channels 2 and 3. In FIG. 3b, the serial transmission is also represented by a series of bit fields. However, for each channel transmission, the first half of the next bit field is sent subsequent to the second half of a previous bit field. For example, as shown in FIG. 3b, the first half of the next bit field (channel 1, slot 1B) is sent subsequent to the second half of a previous bit field (channel 1, slot 2A). The letters A,B,C, etc. representing the different bit fields. The transmission still remains contiguous in time since the second half of a bit field is always sent after the first half. Another advantage offered by this format is the reduction of the header information required prior to each bit field. In particular, a shorter header can be used for each channel transmission burst since each transmission burst directed to a specific channel incudes two bit fields.

The channel coder 18 of FIG. 1 converts the formatted multiplexed bit stream into a form suitable for transmission over the radio channel. In the case of 4-phase DPSK transmission, the bits are paired into di-bits (preferably not crossing R-S symbol boundaries) and translated to one of four possible inter-symbol phase shifts.

Figure 4:
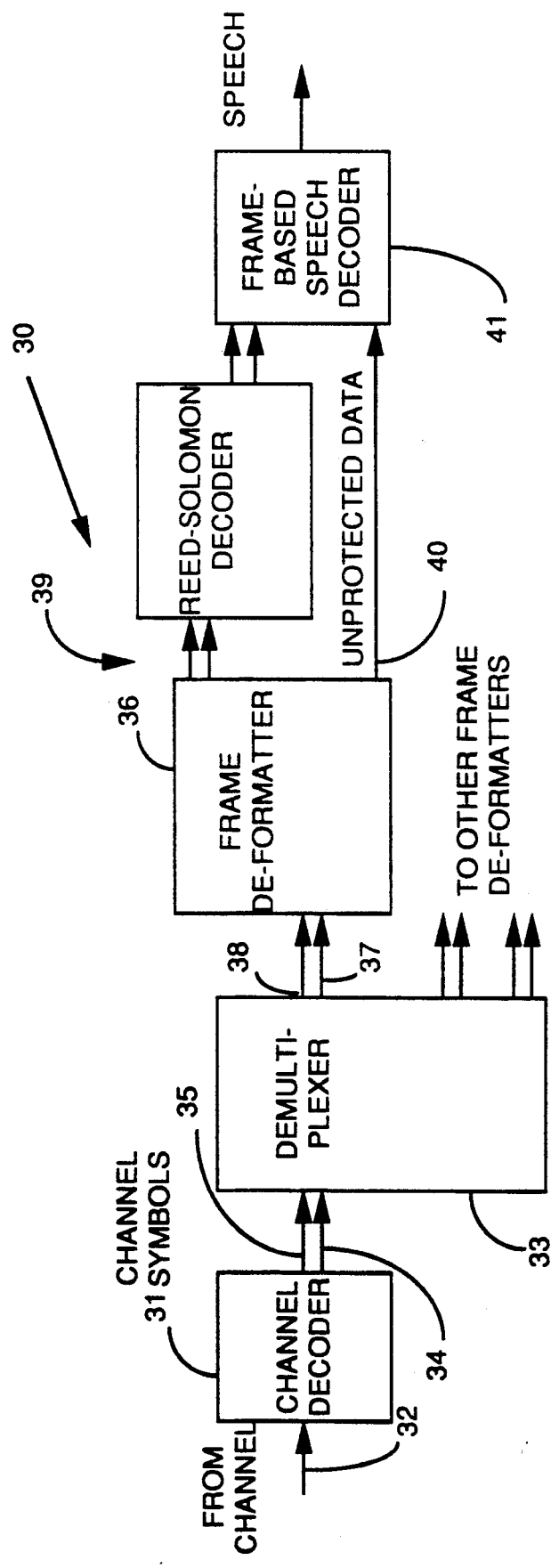
FIG. 4 is a block diagram of the speech decoding section of the radio receiver according to the present invention.

The speech decoding section 30 of the receiver is shown in FIG. 4. Generally, as described below, the decoding section accepts the corrupted bit stream from the transmission channel, attempts to correct transmission errors using the protection bits, and regenerates the speech waveform with as little subjective quality degradation as possible, relative to the original speech.

The channel decoder 31 converts the received radio signal 32 back into a binary data stream having a number of channel symbols. For each channel symbol, the probability that the received radio signal was correctly decoded is estimated. This estimation can be based on received radio signal strength or by the relative proximity of the received signal to the nearest radio symbol division boundary. In the case of DPQSK where the inter-symbol phase shifts are ideally multiples of 90 degrees, the division boundaries are 45 degrees away from the ideal values. A received phase shift of 45 degrees, for example, would lie on a decision boundary and the probability of correct decoding would be low. This probability is compared to a threshold to produce erasure information for the corresponding bits (channel symbols) in the data stream: a bit with a high probability of error is marked as erased. In the case of 4-phase DPSK, inter-symbol phase shifts are translated into one of four di-bit values. The probability of correct decoding can be estimated, for example, to vary with the phase angle distance to the nearest decoding decision boundary.

The demultiplexer block 33 separates the received data bit-stream 34 and corresponding erasure information 35 into a number of speech channels (three channels in the preferred implementation). Each channel is a bit stream consisting of two transmission bursts per TDMA time frame, occupying the appropriate fraction of the total frame.

Figure 5:
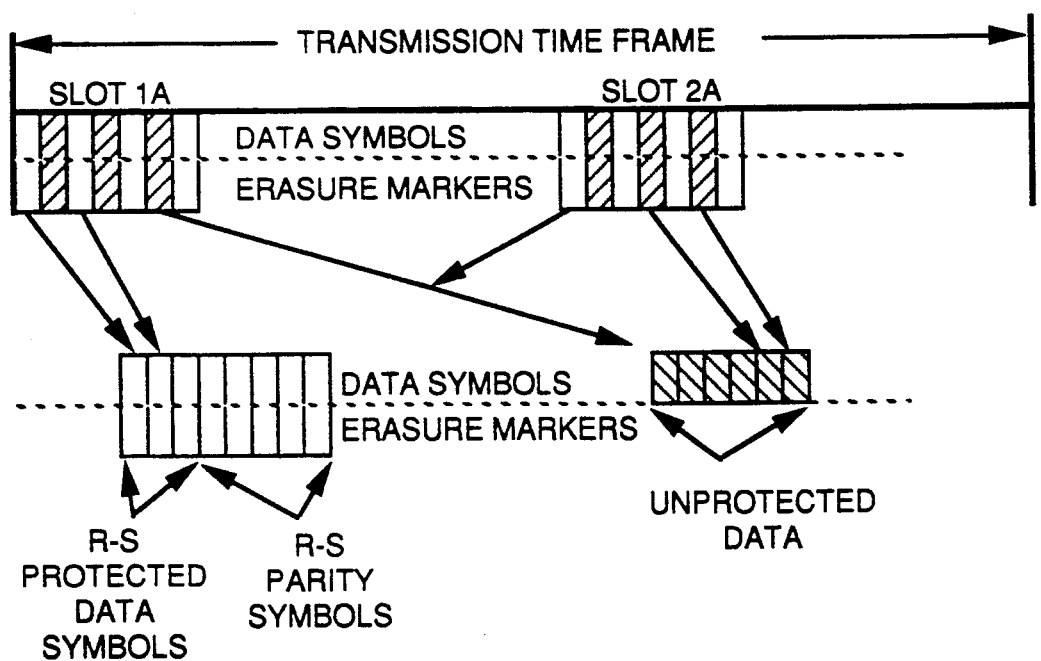
FIG. 5 is an illustrative example of the frame de-formatting scheme of the present invention.

The frame de-formatting scheme is represented in FIG. 5. The frame de-formatter 36 accepts the interleaved data 37 from each de-multiplexed channel and collects it into the original protected (R-S block) 39 and unprotected data fields 40. The erasure information 38 corresponding to the protected data is also collected. The erasure information corresponding to the unprotected data is discarded. The data collection operation in the de-formatter 36 is the reverse of the interleave operation in the formatter 16.

Figure 6:
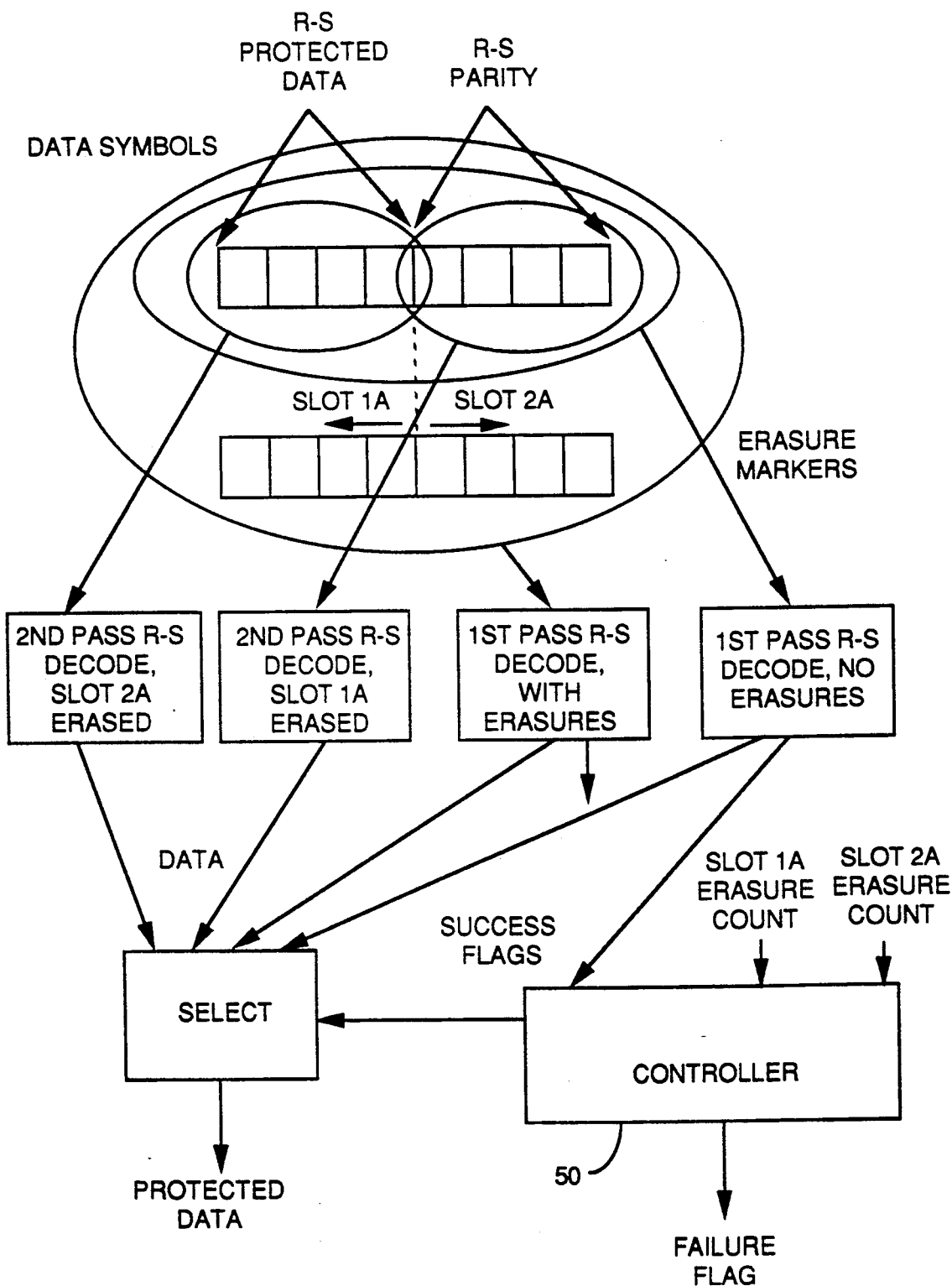
FIG. 6 is an illustrative example of the Reed-Solomon decoding scheme according to the present invention.

The operation of the Reed-Solomon decoder is described in FIG. 6. Generally, this decoder attempts to correct any errors in the received R-S block. It also sets a flag to indicate whether the output data block is likely to be correct. This is a two-pass decoding operation, i.e. if the first attempt to decode an R-S block is unsuccessful, a second pass is attempted.

The first step in the decoding process is to convert the bit-erasure information originating from the channel decoder 31 into R-S symbol erasure markers. The logic used is to mark an R-S symbol as erased if any of the bits comprising it is erased. The selection of the appropriate R-S correction and the setting of the failure flag is controlled by the controller block 50.

Figure 7:
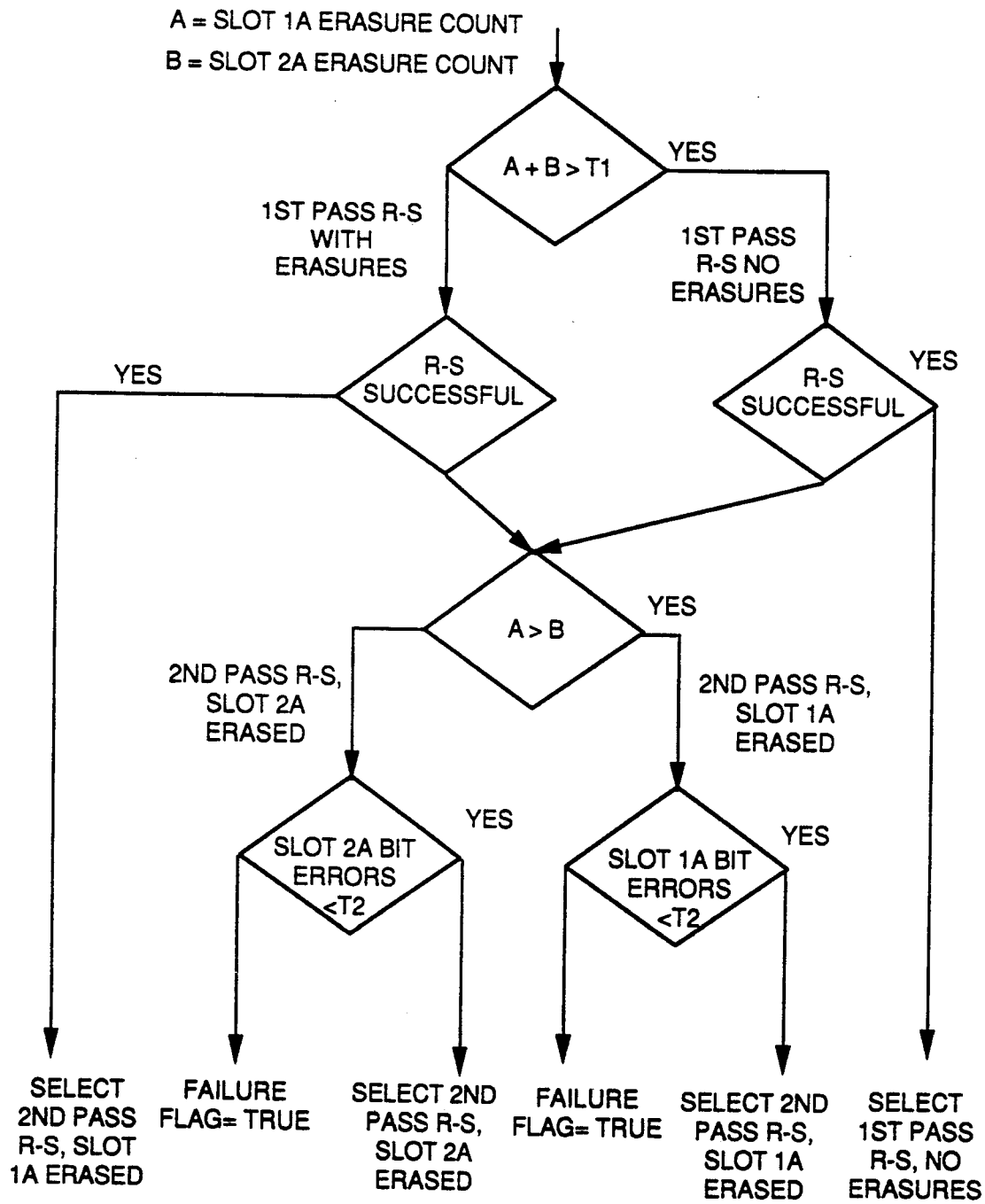
FIG. 7 is a logic diagram description of the controller shown in FIG. 6.

The operation of the controller block is described in the form of a logic diagram in FIG. 7. Once the R-S symbols have been marked, the next step is to count the total number of R-S symbol erasures in the first and second slots, denoted A and B respectively. If the total $(A+B)$ is less than or equal to a threshold T1, a standard R-S forward error correction is performed on the input data block, using the erasure markers, as described in the above reference. If the total $(A+B)$ is greater than the threshold T1, a standard R-S forward error correction is performed without symbol erasures. The full correction power of the code is utilized in either case. In the preferred implementation, this implies that the decoder attempts to locate and correct $(16-A-B)/2$ symbol errors (rounded down) in the first case or six symbol errors in the second case. If this correction is successful, the flag is set to indicate to decoder 41 that a successful error correction has been performed. The corrected data is then sent to the speech decoder 41. Otherwise, a second R-S block error correction is attempted. In this case, the A and B erasure counts are compared to determine which slot has fewer erasures. All the symbols in the slot with the greater number of erasures are marked as erased. None of the symbols in the slot with fewer erasures are marked as erased. A standard Reed-Solomon forward error correction is now performed, which effectively reconstructs the erased slot from the information in the non-erased slot. Finally, the bits in the reconstructed (erased) slot are compared to the bits of the de-multiplexed slots. The number of unequal bits (bit errors) are counted and compared to a second threshold T2. If the number of bit errors is less than T2, the flag is set to indicate to decoder 41 that a successful error correction has been performed. The corrected data is then sent to the speech decoder 41. Otherwise, the flag is set to indicate a failure and the protected data for this frame is lost.

What is claimed is:

1. A method of coding a speech waveform prior to transmission, for reducing transmission errors in a digital cellular mobile radio system which transmits a plurality of digitally encoded time-division multiplexed signals over multiplexed channels, comprising the steps of:

encoding an input speech waveform into a protected and an unprotected bit field;

segmenting said protected bit field into Reed-Solomon symbols;

appending a number of parity bits to said Reed-Solomon symbols to form an R-S block code;

interleaving said protected bit field with said unprotected bit field to provide an interleaved bit stream comprised of coded blocks;

separating the coded blocks to form slots separated in time;

multiplexing the separated slots of a number of speech channels to provide a formatted bit stream wherein slots of coded blocks of one channel are separated in time, by slots of coded blocks of other channels;

segmenting the formatted bit stream into channel symbols; and coding the channel symbols into a form suitable for transmission over a radio channel.

2. A method of reducing transmission errors as defined in claim 1, wherein each of said slots of each channel is separated in time such that a first slot of one coded block of a first channel is separated from a second slot of the one coded block by first slots of coded blocks of other channels.

3. A method of reducing transmission errors as defined in claim 1, wherein each sub-block of a coded block of each channel is separated in time from each other, by inserting, upon multiplexing, coded sub-blocks of coded blocks of other channels, such that for a given channel, a second sub-block of a previous coded block is sent prior to a first sub-block of a subsequent coded block.

4. A method of decoding a speech signal encoded as described in claim 1, comprising the steps of:

receiving a radio signal transmitted over a radio channel;

converting the received radio signal into a stream of channel symbols;

estimating, for each channel symbol in said stream, the probability of correct decoding;

comparing the estimated probability with a threshold value to produce channel symbol erasure information;

demultiplexing the stream of channel symbols to obtain, for each speech channel, separate slots containing interleaved data and corresponding erasure information;

collecting the interleaved data from each speech channel to form R-S blocks and unprotected data;

converting the channel symbol erasure information into R-S symbol erasure markers;

counting the number of R-S symbol erasure markers for each slot;

summing the number of R-S symbol erasure marker;

performing a standard R-S forward error correction on said R-S block using said erasure markers, if said sum is less than or equal to a predetermined threshold T1;

performing a standard R-S forward error correction on said R-S block, without symbol erasures, if said sum is greater than said predetermined threshold T1;

setting a flag to indicate if a successful error correction has been performed; and sending the corrected data to a frame speech decoder.

5. A method of decoding a speech signal as defined in claim 4, wherein a second R-S forward error correction is performed on said R-S block if said first error correction was unsuccessful, further comprising the steps of:

comparing the number of erasure markers for each of said slot;

marking, as erased, all symbols in a slot with a greater number of erasure markers;

performing a standard R-S forward error correction to reconstruct said symbols, marked as erased, from information contained in non-erased symbols;

setting a flag to indicate an unsuccessful error correction, if the number of bits in error is greater than or equal to a threshold T2;

setting a flag to indicate a successful error correction, if the number of bits in error is less than a threshold T2; and sending the corrected data to said frame speech decoder.

6. A method of coding a speech waveform prior to transmission, for reducing transmission errors in a digital cellular mobile radio system which transmits a plurality of digitally encoded time-division multiplexed signals over multiplexed channels, comprising the steps of:

encoding a short time frame of an input speech waveform into a protected and an unprotected bit field;

segmenting said protected bit field into Reed-Solomon symbols;

calculating the number of parity bits required for said protected bit field;

appending a number of parity bits to said Reed-Solomon symbols to form an R-S block code;

sending said unprotected bit field and said R-S block code to a frame formatter;

interleaving said protected bit field with said unprotected bit field to provide an interleaved bit stream;

separating the interleaved bit stream to form separated slots;

multiplexing the separated slots of a number of speech channels to provide a formatted bit stream wherein slots of coded blocks of one channel are separated in time, by slots of coded blocks of other channels;

segmenting the formatted bit stream into channel symbols; and coding the channel symbols into a form suitable for transmission over a radio channel.

7. A method of reducing transmission errors as defined in claim 6, wherein each of said slots of each channel is separated in time such that a first slot of one coded block of a first channel is separated from a second slot of the one coded block by first slots of coded blocks of other channels.

8. A method of reducing transmission errors as defined in claim 6, wherein each sub-block of a coded block of each channel is separated in time from each other, by inserting, upon multiplexing, coded sub-blocks of coded blocks of other channels, such that for a given channel, a second sub-block of a previous coded block is sent prior to a first sub-block of a subsequent coded block.

9. A method of decoding a speech signal encoded as described in claim 6, comprising the steps of:

receiving a radio signal transmitted over a radio channel;

converting the received radio signal into a stream of channel symbols;

estimating, for each channel symbol in said stream, the probability of correct decoding;

comparing the estimated probability with a threshold value to produce channel symbol erasure information;

demultiplexing the stream of channel symbols to obtain, for each speech channel, separate slots containing interleaved data and corresponding erasure information;

collecting the interleaved data from each speech channel to form R-S blocks and unprotected data;

collecting the erasure information corresponding to the R-S blocks;

discarding the erasure information corresponding to the unprotected data;

converting the channel symbol erasure information into R-S symbol erasure markers;

counting the number of R-S symbol erasure markers for each slot;

summing the number of R-S symbol erasure marker;

performing a standard R-S forward error correction on said R-S block using said erasure markers, if said sum is less than or equal to a predetermined threshold T1;

performing a standard R-S forward error correction on said R-S block, without symbol erasures, if said sum is greater than said predetermined threshold T1;

setting a flag to indicate if a successful error correction has been performed; and sending the corrected data to a frame speech decoder.

10. A method of decoding a speech signal as defined in claim 9, wherein a second R-S forward error correction is performed on said R-S block if said first error correction was unsuccessful, further comprising the steps of:

comparing the number of erasure markers for each of said slot;

marking, as erased, all symbols in a slot with a greater number of erasure markers;

performing a standard R-S forward error correction to reconstruct said symbols, marked as erased, from information contained in non-erased symbols;

comparing reconstructed bits with said separate slots;

counting the number of bits in error;

setting a flap to indicate an unsuccessful error correction, if the number of bits in error is greater than or equal to a threshold T2;

setting a flag to indicate a successful error correction, if the number of bits in error is less than a threshold T2; and sending the corrected data to said frame speech decoder.

* * * * *